United States Patent [19]
Jeong et al.

[11] Patent Number: 5,673,225
[45] Date of Patent: Sep. 30, 1997

[54] WORD LINE VOLTAGE BOOSTING CIRCUIT AND METHOD THEREOF

[75] Inventors: Woo-Seop Jeong; Ho-Cheol Lee, both of Seoul, Rep. of Korea

[73] Assignee: Samsung Electronics Co., Ltd., Suwon, Rep. of Korea

[21] Appl. No.: 623,772

[22] Filed: Mar. 29, 1996

[30] Foreign Application Priority Data

Mar. 31, 1995 [KR] Rep. of Korea ............... 7512/1995

[51] Int. Cl.⁶ .................. G11C 7/00; G11C 8/00
[52] U.S. Cl. ........... 365/189.11; 365/203; 365/230.06; 365/226
[58] Field of Search ............ 365/189.11, 203, 365/230.06, 226

[56] References Cited

U.S. PATENT DOCUMENTS

| | | | |
|---|---|---|---|
| 4,896,297 | 1/1990 | Miyatake et al. | 365/189.11 |
| 5,184,035 | 2/1993 | Sugibayashi | 365/189.11 |
| 5,246,333 | 9/1993 | Maeda | 365/189.11 |
| 5,255,224 | 10/1993 | Galbi et al. | 365/189.11 |
| 5,287,325 | 2/1994 | Morita | 365/230.06 |
| 5,550,775 | 8/1996 | Abe et al. | 365/189.11 |

*Primary Examiner*—David C. Nelms
*Assistant Examiner*—Trong Quang Phan
*Attorney, Agent, or Firm*—Cushman Darby & Cushman, IP Group of Pillsbury Madison & Sutro LLP

[57] ABSTRACT

A word line voltage boosting circuit varies a word line output voltage according to variation of the number of the word lines to be activated. A boosting circuit boosts a word line voltage which has been precharged to a first level voltage to a second level voltage in response to an activation signal. A voltage adding circuit further boosts the word line voltage to a third voltage level by adding a predetermined voltage to the second level voltage if the number of the word lines to be activated increases. A driving circuit includes a bootstrap circuit for stably providing the boosted word line voltage to an output line.

9 Claims, 4 Drawing Sheets

WORD LINE VOLTAGE BOOSTING CIRCUIT AND METHOD THEREOF

BACKGROUND OF THE INVENTION

1. Field of the Invention

The present invention relates to semiconductor memory devices, and more particularly, to a word line voltage boosting circuit and method which varies a word line voltage according to the number of word lines to be activated.

2. Description of the Related Art

In semiconductor memories such as Dynamic Random Access Memories (DRAMs) or Static Random Access Memories (SRAMs), in order to fully read or write data stored in a memory cell, a voltage higher than the voltage level of the data should be provided to the word lines. Therefore, a word line voltage boosting circuit that supplies a boosted voltage to the word lines is desirably provided. In addition, as the operating speeds of semiconductor memory devices have improved, circuits and components with higher responding speeds have actively been researched. Specifically, if more memory cells can be selected by a single activating operation, the semiconductor memory device can be improved for high speed operations. Various mode operations such as block write and fast page mode may be used for such high speed operations.

However, it is more efficient to vary the number of memory cells to be activated according to the number actually needed by a user. To this end, a bonding option word line voltage boosting circuit has been studied. Such a circuit supplies an adaptive word line voltage to the word lines according to a variable number of the word lines to be activated. FIG. 1 shows one conventional bonding option word line voltage boosting circuit, which is comprised of a precharge circuit 2, a boosting circuit 4, a word line driver 8, a control circuit 6 and an output voltage discharging circuit 10.

In the precharge circuit 2, a clock signal $\phi$RG is commonly connected to the input terminals of inverter 12 and capacitor 14. An output terminal of the inverter 12 is connected to one terminal of a capacitor 22, and the other terminal of the capacitor 22 is connected to a gate of an N-channel transistor 24. A drain of the N-channel transistor 24 and a gate and drain of an N-channel transistor 26 are coupled to one another and are also commonly connected to a power supply voltage Vcc. Sources of the N-channel transistors 24 and 26 are coupled to each other and are also commonly connected to an output line of the boosting circuit 4 (which will be described below). One terminal of the capacitor 14 is connected to a gate of an N-channel transistor 18. A drain of the N-channel transistor 18 and the gate and drain of an N-channel transistor 20 are coupled to one another and are also commonly connected to a power supply voltage Vcc. A source of an N-channel transistor 16 which has its drain and gate connected to a power supply voltage Vcc is connected to a node N1 on a line connecting one terminal of the capacitor 14 to the gate of the N-channel transistor 18. Sources of the N-channel transistors 18 and 20 are coupled to each other and are also connected to a node N2 on a line connecting the capacitor 22 to the gate of the N-channel transistor 24.

In the boosting circuit 4, the clock signal $\phi$RG is applied to an inverter 28 of four serially connected inverters 28 to 34. An output terminal of the inverter 34 is connected to one terminal of a capacitor 36 and the other terminal of the capacitor 36 is connected to the word line driver 8 and control circuit 6.

The word line driver 8 is composed of serially connected N-channel transistors 78 and 80. The N-channel transistor 78 has its drain connected to an output terminal of the boosting circuit 4 and its gate connected to an output terminal of the control circuit 6. The N-channel transistor 80 has its gate connected to a standby signal $\phi$WLD and its source connected to a ground voltage Vss. Between the N-channel transistors 78 and 80 is a node N5 connected an output line 100.

In the control circuit 6, the clock signal $\phi$RG and an activation signal $\phi$WL are respectively connected to the input terminals of a NAND gate 40, and an output terminal of the NAND gate 40 is connected to input terminals of inverter 42 and capacitor 44. The other terminal of the capacitor 44 is connected to a ground voltage Vss. An output terminal of the inverter 42 is commonly connected to a drain of an N-channel transistor 54 and a gate of an N-channel transistor 46 having its drain connected to a power supply voltage Vcc. A source of the N-channel transistor 46 is commonly connected to a drain of an N-channel transistor 48 which receives the standby signal $\phi$WLD at its gate and to a gate of an N-channel transistor 52. Sources of the N-channel transistors 48 and 52 are commonly connected to a ground voltage Vss. A gate of a P-channel transistor 50 having its source connected to a power supply voltage Vcc is connected to the clock signal $\phi$RG, and a drain of the P-channel transistor 50 is connected to a drain of the N-channel transistor 52. A source of an N-channel transistor 56 having its gate connected to a power supply voltage Vcc is connected to a gate of the N-channel transistor 54. A drain of the N-channel transistor 56 is connected to a source of an N-channel transistor 58, and the drain of the N-channel transistor 56 and source of the N-channel transistor 58 are commonly connected to a source of an N-channel transistor 60. A drain of the N-channel transistor 58 is connected to a power supply voltage Vcc. A connection node 51 between the P-channel transistor 50 and N-channel transistor 52 is connected to a gate of an N-channel transistor 70. A connection node 63 on a connection line 61 between the connection node 51 and the N-channel transistor 70 is connected to a drain of the N-channel transistor 60 and a connection node 65 on the connection line 61 is connected to an input terminal of an inverter 64. An output terminal of the inverter 64 is connected to an input terminal of an inverter 66 and an output terminal of the inverter 66 is connected to a gate of the N-channel transistor 60. A connection node 67 between the inverters 64 and 66 is connected to an output terminal of a PMOS capacitor 62 and an input terminal of the PMOS capacitor 62 is connected to a power supply voltage Vcc. A connection node 69 between the PMOS capacitor 62 and the connection node 67 is connected to a gate of the N-channel transistor 58. A source of the N-channel transistor 54 is commonly connected to gates of the N-channel transistors 68 and 78. A node N3 on a line connecting the source of the N-channel transistor 54 to the gate of the N-channel transistor 68 is connected to a drain of an N-channel transistor 74 having a gate connected to a power supply voltage Vcc. A source of the N-channel transistor 74 is connected to a drain of an N-channel transistor 76 having a gate connected to the standby signal $\phi$WLD, and a source of the N-channel transistor 76 is connected to a ground voltage Vss. A connection node 73 between the node N3 and the drain of the N-channel transistor 74 is connected to one terminal of a capacitor 72. A source of the N-channel transistor 68 is commonly connected to a drain of the N-channel transistor 70 and to the other terminal of the capacitor 72. A source of the N-channel transistor 70 is connected to a ground voltage Vss.

In the output voltage discharging circuit 10, a drain of an N-channel transistor 82 is connected to a node N5 on an output line 100. A gate of the N-channel transistor 82 is connected to a source of an N-channel transistor 86 having its gate connected to a power supply voltage Vcc. A drain of the N-channel transistor 86 is connected to a mode operation signal φXi. A source of the N-channel transistor 82 is connected to one terminal of a capacitor 84, and the other terminal of the capacitor 84 is connected to a ground voltage Vss. A connection node 83 between a source of the N-channel transistor 82 and the input terminal of the capacitor 84 is connected to a drain of an N-channel transistor 90 having a gate connected to the standby signal φWLD. A source of the N-channel transistor 90 is connected to a ground voltage Vss.

FIG. 2 is an operational timing diagram of a conventional word line voltage boosting circuit such as that of FIG. 1. Operations of the word line voltage boosting circuit will now be discussed with reference to FIGS. 1 and 2.

Initially, i.e. before the word line voltage boosting circuit is activated, the node N1 in the precharge circuit 2 is precharged to a voltage level of Vcc-Vt (where Vt is a threshold voltage of a transistor 16), and thereby the voltage at the node N2 is boosted to a predetermined voltage level. With the voltage at the node N2 being boosted, the voltage at the node N4 connected to the output terminal of the capacitor 36 becomes Vcc level. In an inactive state, the voltage at the node N3 is 0 volts.

If the activation signal φWL goes from a logic "low" level to a logic "high" level, the standby signal φWLD and clock signal φRG go to logic "low" and "high" levels, respectively, and thereby the voltage at each of the nodes is changed as follows. The voltage at the node N1 is boosted to a first voltage level $(=\alpha)$ by a boosting operation of the capacitor 14. The voltage at the node N2 drops in accordance with the voltage transition of the input terminal of the capacitor 22 from a logic "high" level to a logic "low" level, and then is set to a power supply voltage level by a power supply voltage supplied through the N-channel transistor 18. With a voltage drop of the node N2 from a predetermined voltage level to a Vcc level, the voltage at the node N4 also drops to a power supply voltage Vcc. If the input terminal of the capacitor inputting the clock signal φRG of logic "high" level goes from a logic "low" level to a logic "high" level, the voltage at the node N4 is boosted to a second voltage level $(=\beta)$ in proportion thereto. The voltage at node N3 in the control circuit 6 becomes a power supply voltage level by receiving the activation signal φWL and clock signal φRG. Almost at the same time, the output voltage of the boosting circuit 4 is transferred to the capacitor 72 through the N-channel transistor 68 and then is boosted to a third voltage level $(=\gamma)$ by a boosting operation of the capacitor 72. It should be noted that $\beta<\gamma$. A closed circuit composed of the N-channel transistor 68, capacitor 72 and node N3 in the control circuit 6 is a bootstrap circuit serving to output voltage without loss. The third voltage at the node N3 allows the N-channel transistor 78 to be fully conducted and thereby the second voltage, i.e. the boosted voltage of the node N4, is fully output to the output line 100.

In a first mode, when the greatest number of word lines are activated, the second voltage of the node N4 is applied to the word lines without being dropped. However, when the number of word lines to be activated is less than that in the first mode, the voltage to be applied to the word lines is adaptively dropped, which is performed by the output voltage discharging circuit 10. Although the third voltage boosted in the boosting circuit 4 is applied to the word lines without being dropped in the first mode, the second voltage is supplied to the word lines after being dropped by a predetermined voltage level in the second mode when the number of the word lines to be activated is less than that in the first mode. The mode operation signal φXi transfers a pulse with a predetermined width adequate for a mode operation to the N-channel transistor 82 through the conducted channel of the N-channel transistor 86. In response thereto, the N-channel transistor 82 conducts for a period of time corresponding to the pulse width. If the N-channel transistor 82 conducts for a predetermined time as described above, the second voltage supplied to the output line 100 accumulates in the capacitor 84. Thereby, the voltage at the output line 100 drops by a predetermined voltage level and a voltage adaptive to the number of the word lines to be activated is output to the word lines. The potential accumulated at the capacitor 84 is discharged to ground via the N-channel transistor 90. When the number of the word lines to be activated is less than that in the second mode, the pulse width of the mode operation signal φXi becomes wider than that in the second mode. Thereby, the output line voltage is dropped even more than that in the second mode. Accordingly, the word line voltage supplied through the output line varies.

In this word line voltage boosting circuit, the output line voltage varies according to mode and is accumulated in the capacitor 84 during all mode operations except the first mode. The potential accumulated at the capacitor 84 is then discharged during an inactivation mode. This causes greater power consumption. In addition, the noise generated during the discharge of the potential may increase the stress affecting the components in the circuit, thereby resulting in an unstable operation.

SUMMARY OF THE INVENTION

It is therefore an object of the present invention to provide a semiconductor memory device which reduces power consumption.

It is another object of the present invention to provide a semiconductor memory device which reduces noise.

It is another object of the present invention to provide a semiconductor memory device which varies a word line voltage in accordance with number of word lines to be activated without increasing power consumption or increasing noise.

To achieve these and other objects, a word line voltage boosting circuit and method according to the present invention boosts a word line output voltage according to an increase in the number of the word lines to be activated. The circuit includes a boosting circuit which boosts a word line voltage which has been precharged to a first level voltage to a second level voltage in response to an activation signal. A voltage adding circuit further boosts the word line voltage to a third voltage level by adding a predetermined voltage to the second level voltage if the number of the word lines to be activated increases. A driving circuit includes a bootstrap circuit for stably providing the boosted word line voltage to an output line.

Because the word line voltage is only boosted in accordance with an increase in the number of word lines to be activated, the word line voltage boosting circuit and method according to the present invention conserves power consumption in operating modes where the number of activated word lines is a minimum number. Further, because there is no need to discharge an accumulated boosted word line voltage, excess noise is prevented and stress on internal circuit components is reduced.

BRIEF DESCRIPTION OF THE DRAWINGS

These and various other features and advantages of the present invention will be readily understood with reference to the following detailed description taken in conjunction with the accompanying drawings, in which.

DETAILED DESCRIPTION OF THE PREFERRED EMBODIMENT

A preferred embodiment of the present invention will now be discussed in detail with reference to FIGS. 3 and 4.

Figure 1:
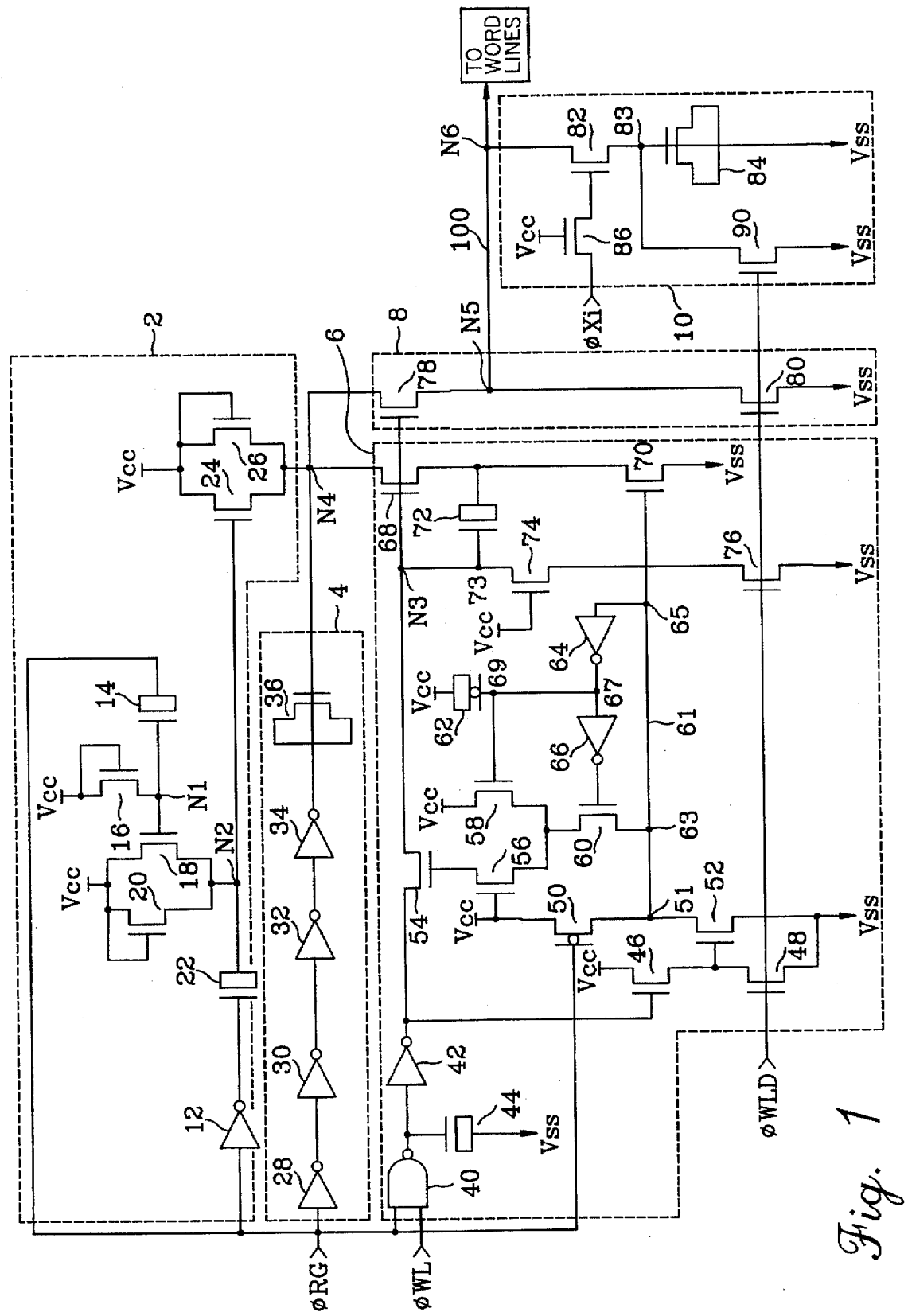
FIG. 1 is a circuit diagram showing a conventional bonding option word line voltage boosting circuit.
Figure 2:
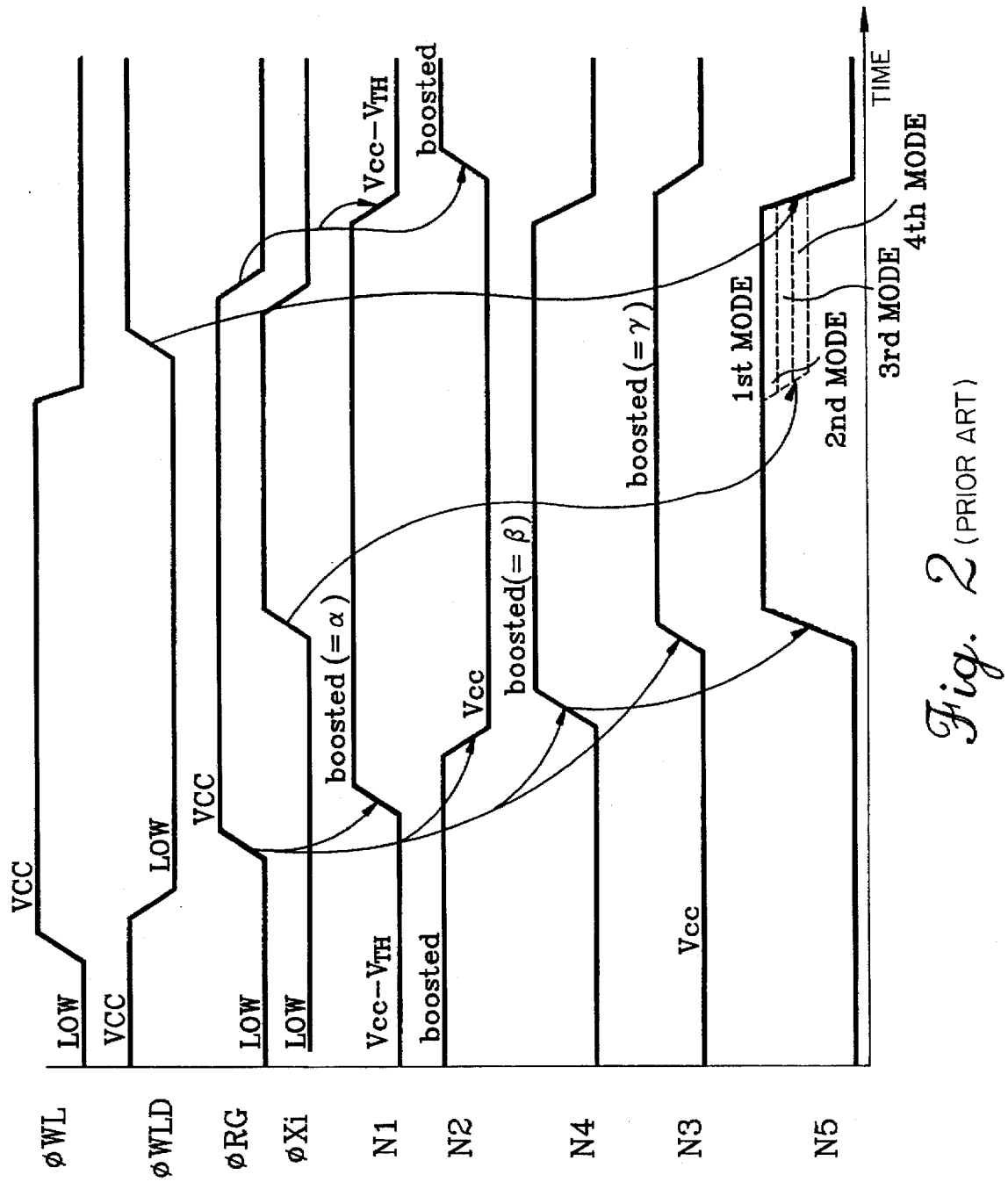
FIG. 2 is an operational timing diagram of the circuit of FIG. 1.
Figure 3:
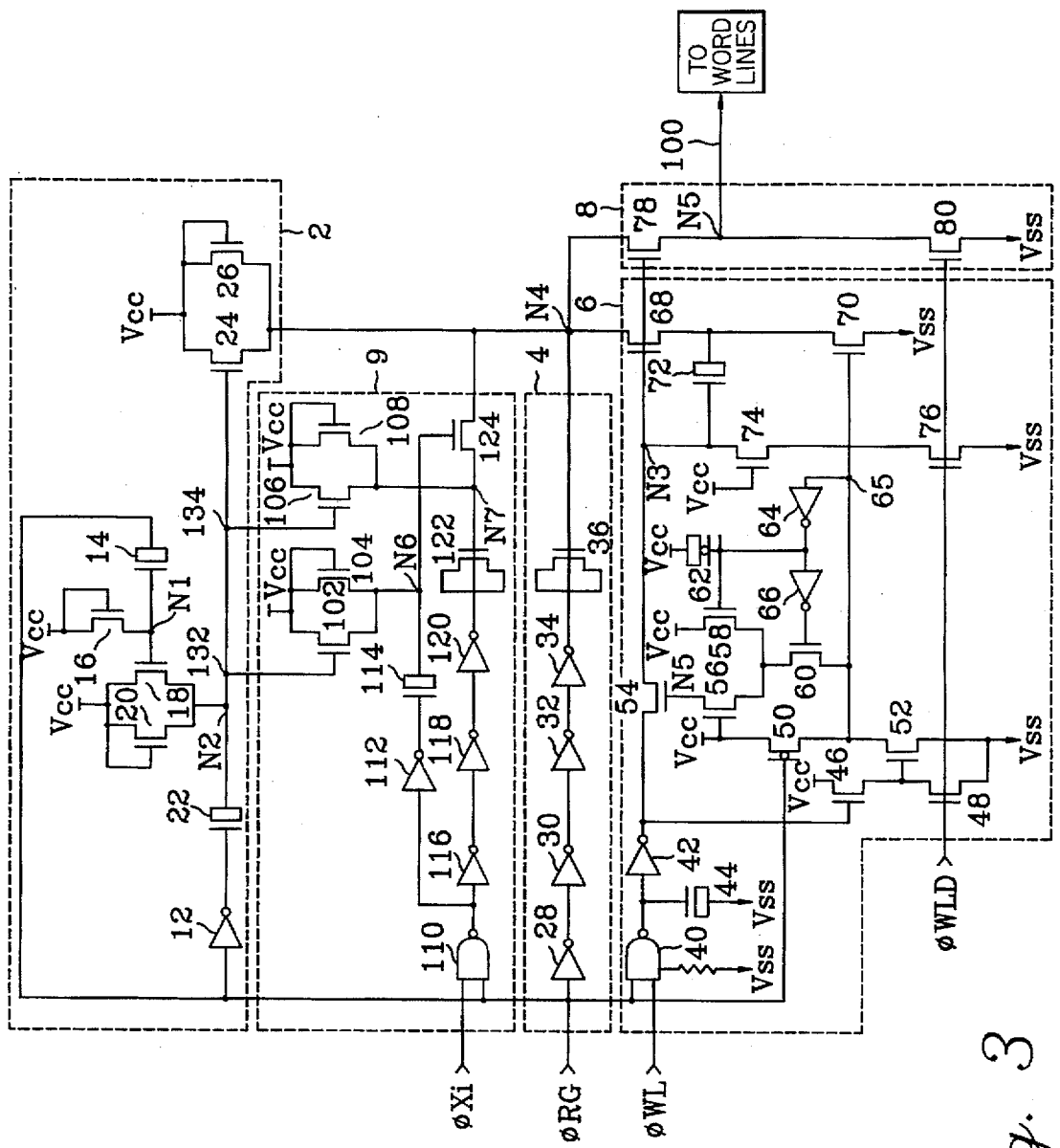
FIG. 3 is a circuit diagram showing a word line voltage boosting circuit according to the present invention.
Figure 4:
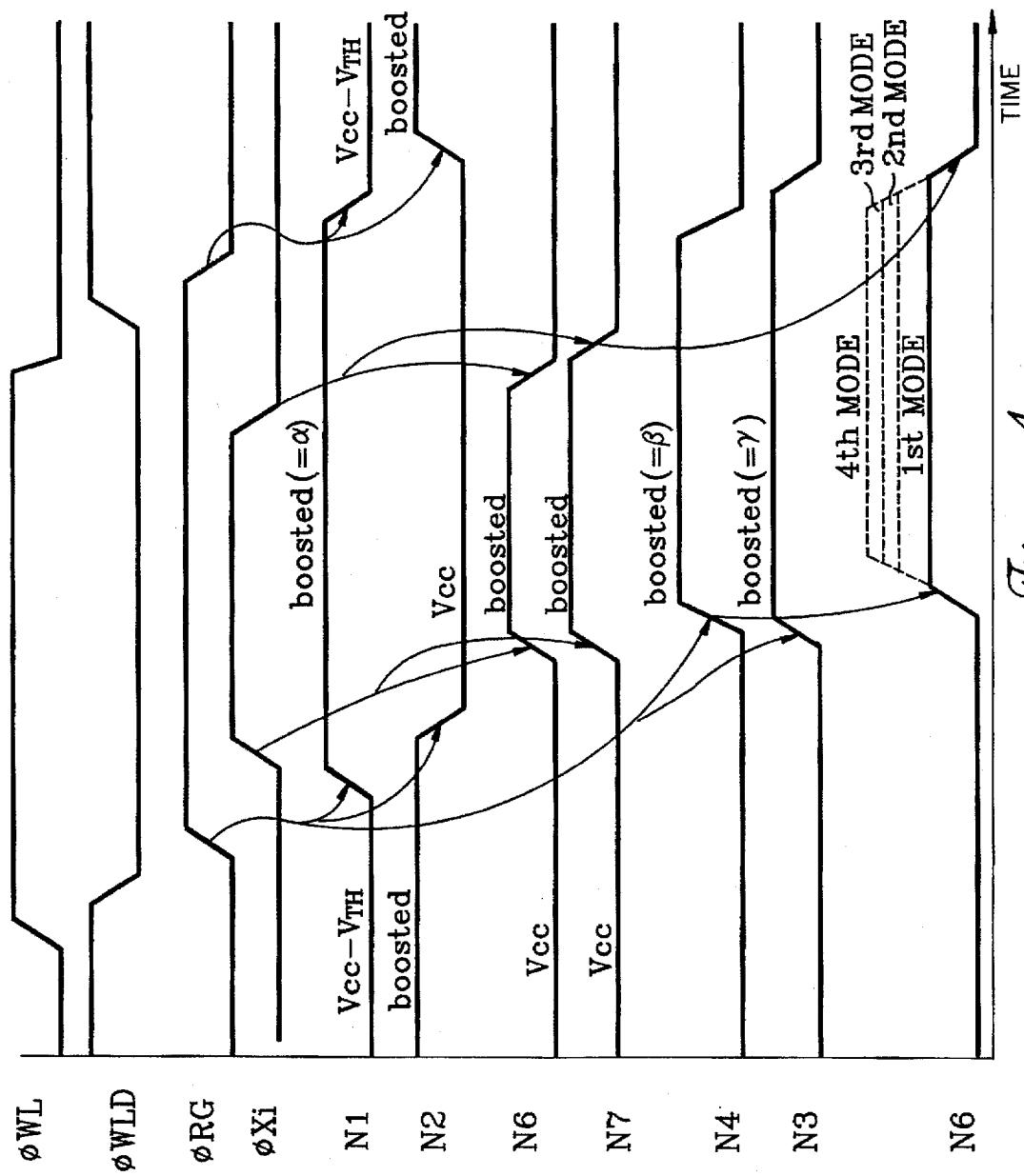
FIG. 4 is an operational timing diagram of FIG. 3.

As shown in FIG. 3, an output voltage adding circuit 9 is connected between a precharge circuit 2 and a boosting circuit 4 instead of the output voltage discharge circuit 10 of FIG. 1. In the output voltage adding circuit 9, a mode selection signal $\phi Xi$ and an activation signal $\phi RG$ are connected to an input terminal of a NAND gate 110. An output terminal of the NAND gate 110 is connected to input terminals of inverters 116 and 112. An output terminal of the inverter 116 is connected in series to inverters 118 and 120, and an output terminal of the inverter 120 is connected to an input terminal of a capacitor 122. In addition, an output terminal of the inverter 112 is connected to an input terminal of a capacitor 114. Output terminals of the capacitors 114 and 122 are connected to the gate and drain of an N-channel transistor 124, respectively. A connection node 132 between a node N2 in the precharge circuit 2 and a gate of the N-channel transistor 24 is connected to a gate of an N-channel transistor 102. A drain of the N-channel transistor 102 and drain and gate of the N-channel transistor 104 are connected to one another and are also connected in common to a power supply voltage Vcc. In addition, sources of the N-channel transistors 102 and 104 are connected to each other and are also connected to a node N6 on a line connecting an output terminal of the capacitor 114 to a gate of the N-channel transistor 124. A gate of the N-channel transistor 106 is connected to a connection node 134 between the connection node 132 and the gate of the N-channel transistor 24. A drain of the N-channel transistor 106 and drain and gate of the N-channel transistor 108 are connected to one another and are also connected in common to a power supply voltage Vcc. Sources of the N-channel transistors 106 and 108 are connected to each other and are also connected to a node N7 between an output terminal of the capacitor 122 and a drain of the N-channel transistor 124.

Operation of the word line voltage boosting circuit according to a preferred embodiment of the present invention will now be discussed. It should be noted that the first mode in the description of the prior art word line voltage boosting circuit means an operation mode when the greatest number of word lines are selected, while a first mode in the following description of the word line voltage boosting circuit according to the present invention means an operation mode when the least number of word lines are selected.

Initially, i.e. before the word line voltage boosting circuit is activated, the node N1 in the precharge circuit 2 is precharged to a voltage level of Vcc-Vt (where Vt is a threshold voltage of a transistor 16), and thereby the voltage at the node N2 is boosted to a predetermined voltage level. With the boosting of the voltage at the node N2, the voltage at the node N4 connected to the output terminal of the capacitor 36 becomes Vcc level, and the voltages at nodes N6 and N7 also become a power supply voltage level. In an inactive state, the voltage at the node N3 is 0 volts.

If the activation signal $\phi WL$ goes from a logic "low" level to a logic "high" level, the standby signal $\phi WLD$ and clock signal $\phi RG$ go to logic "low" and "high" levels, respectively, and thereby the voltage at each of the nodes is changed as follows. The voltage at the node N1 is boosted to a first voltage level ($=\alpha$) by a boosting operation of the capacitor 14. The voltage at the node N2 drops in accordance with the voltage transition of the input terminal of the capacitor 14 from a logic "low" level to a logic "high" level, and then is set to a power supply voltage level by a power supply voltage supplied through the N-channel transistor 18 because the voltage at the node N1 is boosted.

With a voltage drop of the node N2 from a predetermined voltage level to a Vcc level, the voltage at the node N4 also remains to a power supply voltage Vcc. If the input terminal of the capacitor inputting the clock signal $\phi RG$ of logic "high" level goes from a logic "low" level to a logic "high" level, the voltage at the node N4 is boosted to a second voltage level ($=\beta$) by a boosting operation of the capacitor 36.

The voltage at node N3 in the control circuit 6 becomes a power supply voltage level by receiving the activation signal $\phi WL$ and clock signal $\phi RG$. Almost at the same time, the output voltage of the boosting circuit 4 is transferred to the capacitor 72 through the N-channel transistor 68 and then is boosted to a third voltage level ($=\gamma$) by a boosting operation of the capacitor 72. It should be noted that $\beta<\gamma$. A closed circuit composed of the N-channel transistor 68, capacitor 72 and node N3 in the control circuit 6 is a bootstrap circuit serving to output voltage without loss. The third voltage at the node N3 allows the N-channel transistor 78 to fully conduct and thereby the second voltage, i.e. the boosted voltage of the node N4, is fully output to the output line 100.

In the first mode when the least number of word lines are selected, the second voltage at the node N4 is provided to the word lines without being increased. However, when the number of the word lines to be activated is greater than that in the first mode, the second voltage to be supplied to the word lines should be adaptively increased in proportion thereto, which is performed by the output voltage adding circuit 9. While the second voltage boosted in the boosting circuit 4 is applied to the word lines without being increased in the first mode when the least number of the word lines are activated, in the second mode when the number of the word lines to be activated is greater than that in the first mode, the second voltage is increased by a predetermined level in proportion thereto. The mode operation signal $\phi Xi$ transfers a pulse with a predetermined width adequate for a mode operation to the NAND gate 110, and in response thereto, the output terminal of the NAND gate 110 goes from a logic "high" level to a logic "low" level. Thereby, the voltage at the nodes N6 and N7 are boosted to a predetermined voltage level, and the N-channel transistor 124, inputting the voltage of the node N6 at its gate, conducts. The voltage at the node N7 is supplied to an output line of the boosting circuit 4, and thereby the voltage at the node N4 is higher than in the first mode. Thus, the voltage at the node N3 is further increased and the N-channel transistor 78 inputting the voltage of the node N3 at its gate fully conducts to fully output the voltage at the node N4.

The word line voltage boosting circuit includes the output voltage adding circuit 9 for increasing an output voltage in modes where the number of the word lines to be activated is greater than that in the first mode. Consequently, the word line voltage boosting circuit according to the present invention operates in a first mode for outputting a second level voltage from the boosting circuit 4 in the first mode when the least number of word lines are activated, and in a second mode for outputting an adaptive voltage by adding the voltage generated in the output voltage adding circuit 9 to the second level voltage if the number of the word lines to be activated increases.

When many more word lines are activated than in the second mode, it is possible to further include another output voltage adding circuit which responds to the mode operation signal having a pulse with a different predetermined pulse width than in the second mode.

As described above, the word line voltage boosting circuit according to the present invention is capable of reducing power consumption because the voltage voltage discharge required in the conventional circuit due to mode operations is unnecessary. This voltage discharge prevention may further reduce noise generated within the circuit, thereby realizing a semiconductor memory device capable of performing a stable operation.

Although the present invention has been described in detail with reference to the preferred embodiment thereof, those skilled in the art will readily appreciate that various substitutions and modifications can be made thereto without departing from the spirit and scope of the invention as set forth in the appended claims.

What is claimed:

1. A word line voltage boosting circuit for a semiconductor memory device, comprising:
   a boosting circuit which boosts a word line voltage from a first voltage level to a second voltage level in response to an activation signal when less than a first predetermined number of word lines are activated;
   a voltage adding circuit coupled to an output of said boosting circuit which further boosts said word line voltage to a third voltage level greater than said second voltage level in response to a mode operation signal, such that said voltage adding circuit is not operative to boost said word line voltage to said third voltage level until at least said first predetermined number of word lines are activated; and
   a word line driving circuit coupled to said output of said boosting circuit and an output of said voltage adding circuit which supplies said boosted word line voltage having one of said second voltage level and said third voltage level to an output line.

2. The word line voltage boosting circuit according to claim 1, further comprising a precharge circuit which precharges said word line voltage to said first voltage level.

3. The word line voltage boosting circuit according to claim 1, wherein said word line voltage driving circuit includes a bootstrap circuit which stably provides said boosted word line voltage to said output line.

4. The word line voltage boosting circuit according to claim 1, wherein said voltage adding circuit includes a plurality of voltage adders, certain of said plurality of voltage adders being selected to correspond with a plurality of predetermined numbers of activated word lines, an additional one of said voltage adders being selected in response to an increased predetermined number of activated word lines so that an increased third voltage level results therefrom.

5. A word line voltage boosting circuit according to claim 4, wherein said plurality of voltage adders are respectively selected in response to a plurality of predetermined pulse widths of said mode operation signal.

6. An word line voltage boosting method of a semiconductor memory device, comprising:
   boosting a word line voltage from a first voltage level to a second voltage level in response to an activation signal when less than a first predetermined number of word lines are activated;
   further boosting said word line voltage to a third voltage level greater than said second voltage level in response to a mode operation signal, said word line voltage being prevented from being boosted to said third voltage level until at least said first predetermined number of word lines are activated; and
   supplying said boosted word line voltage having one of said second voltage level and said third voltage level to an output line.

7. The word line voltage boosting method according to claim 6, further comprising:
   precharging said word line voltage to said first voltage level.

8. The word line voltage boosting method according to claim 6, wherein said step of supplying said boosted word line voltage includes bootstrapping said boosted word line voltage to provide a stable output to said output line.

9. The word line voltage boosting method according to claim 6, wherein said step of further boosting said word line voltage includes selecting one of a plurality of predetermined voltage boosting levels in response to said mode operation signal to form said third voltage level greater than said second voltage level, said plurality of predetermined voltage boosting levels respectively corresponding to a plurality of predetermined numbers of activated word lines greater than said first predetermined number of activated word lines.

* * * * *